United States Patent [19]

Kato et al.

[11] Patent Number: 5,672,529

[45] Date of Patent: Sep. 30, 1997

[54] METHOD OF MANUFACTURING NONVOLATILE SEMICONDUCTOR MEMORY DEVICE

[75] Inventors: Masataka Kato, Musashino; Tetsuo Adachi, Hachioji; Hitoshi Kume, Musashino; Shoji Shukuri, Koganei, all of Japan

[73] Assignee: Hitachi, Ltd., Tokyo, Japan

[21] Appl. No.: 413,263

[22] Filed: Mar. 30, 1995

[30] Foreign Application Priority Data

Mar. 31, 1994 [JP] Japan .................................. 6-062386

[51] Int. Cl.⁶ .................... H01L 21/8247; H01L 21/265
[52] U.S. Cl. ........................ 437/43; 437/52; 437/67
[58] Field of Search ............................. 437/43, 52, 70, 437/67; 252/316

[56] References Cited

U.S. PATENT DOCUMENTS

| | | | |
|---|---|---|---|
| 5,384,272 | 1/1995 | Ibok et al. | 437/43 |
| 5,397,725 | 3/1995 | Wolstenholme et al. | 437/43 |
| 5,432,110 | 7/1995 | Inoue | 437/43 |

FOREIGN PATENT DOCUMENTS

| | | |
|---|---|---|
| 56-142675 | 11/1981 | Japan . |
| 3219496 | 9/1991 | Japan . |

*Primary Examiner*—John Niebling
*Assistant Examiner*—Richard A. Booth
*Attorney, Agent, or Firm*—Antonelli, Terry, Stout & Kraus, LLP.

[57] ABSTRACT

A method of manufacturing a nonvolatile semiconductor memory device which is protected against deterioration in the electron injection/discharge characteristics between a floating gate of a memory cell and a channel. Three layers including a gate oxide film, a first polysilicon layer and a first nitride film are sequentially deposited on a silicon substrate surface and patterned with stripe-like columnwise lines. A second nitride film is formed on side walls of the columnwise lines, respectively. An element isolating insulation film is formed on the silicon substrate surface which is not covered with the first and second nitride films. After removal of the first and second nitride films, a first insulation film is formed on the side walls of the first polysilicon layer. Subsequently, at least two layers including a second insulation film and a second polysilicon layer are deposited and a pattern of rowwise lines extending orthogonally to the columnwise lines are formed by processing correspondingly the second polysilicon layer. Even after formation of the element isolating insulation film, thickening of the gate oxide film at distal portions thereof can be suppressed, whereby variations and deterioration in the characteristic of electron injection based on hot electron and tunnel phenomena can be minimized.

12 Claims, 7 Drawing Sheets

METHOD OF MANUFACTURING NONVOLATILE SEMICONDUCTOR MEMORY DEVICE

BACKGROUND OF THE INVENTION

The present invention relates to a method of manufacturing a nonvolatile semiconductor memory device which is electrically programmable and erasable.

As a hitherto known method of manufacturing a nonvolatile semiconductor memory device of the type mentioned above, there may be mentioned a method disclosed, for example, in JP-A-56-142675. This known nonvolatile semiconductor memory device manufacturing method is directed to reduction in size of memory cells constituting the nonvolatile semiconductor memory device, which will be reviewed below.

According to this known method, three layers including a gate oxide film, a first polysilicon layer and a nitride film are deposited on a silicon substrate surface, whereon these layers are patterned with stripe-like columnwise lines (i.e., they are formed with a pattern of stripe-like lines extending in the columnwise direction) through a so-called patterning process. In succession, n-type impurity ions are implanted in the semiconductor or silicon substrate which is not covered with the three layers mentioned above, to thereby form columnwise lines of n-type impurity diffused layer in the silicon substrate. Subsequently, a field oxide film is grown by using the nitride film on the first polysilicon layer as an oxidation-resistive mask. In this manner, a field oxide film is formed on the n-type impurity diffused region mentioned above. Next, a second polysilicon layer is deposited and patterned with rowwise lines which extend orthogonally to the columnwise stripe-like lines, whereby the first polysilicon layer is so processed as to assume the form of rectangular parallelepiped. Thus, there is realized a floating gate for a memory cell.

With the conventional technique mentioned above, there can be implemented a nonvolatile semiconductor memory device which is constituted by a plurality of memory cells each having a floating gate for storing or accumulating electrons. Among others, the n-type impurity diffused layer formed at each side of the first polysilicon layer serves as a drain or source region for the memory cell and at the same time serves as a data line or a source line shared by the adjacent bits or cells. On the other hand, the second polysilicon layer functions as a word line for the memory cell. As will be appreciated from the above, with the method disclosed in JP-A-56-142675, the memory cell structure can be implemented by using two layers of mask patterns because of simplified processes, wherein the area required for the memory cell can be reduced.

In a memory cell realized by the conventional technique mentioned above, it is however noted that because the surface of the silicon substrate which is not covered with the oxidation-resistive nitride film overlying the first polysilicon layer which formes the floating gate is oxidized to form the field oxide film, wherein the field oxide film is directly brought into contact with the first polysilicon layer. As a consequence, the field oxide film encroaches upon the gate insulation film region under the influence of the field oxidation, increasing thereby the thickness of the gate oxide film at distal or end portions thereof, which results in that the thickness of the gate oxide film formed immediately underneath the floating gate becomes different between the source region and the drain region.

In the nonvolatile semiconductor memory devices known heretofore, the n-type impurity doped before the field oxidation is diffused transversely into the channel more deeply than the region of the gate oxide film having the thickened end portions. More specifically, because the drain region constituted by the n-type diffused layer region bulges outwardly underneath the gate oxide film region having a substantially uniform thickness, thickening of the gate oxide film at the distal end portions of the gate region exerts substantially no adverse influence to the electron injection/discharge characteristic of the floating gate.

In recent years, in accompanying to a trend for implementation of the memory cells in finer and finer structure to such extent that the gate length becomes shorter than 0.4 micron inclusive, a shallow junction with the diffused layer is indispensably required. Such being the circumstances, unless the diffused drain region extends transversely or laterally about 0.1 micron, it is difficult to realize the memory operations in a satisfactory manner. Thus, in the nonvolatile semiconductor memory device disclosed in JP-A-56-142675 in which the region of the gate oxide film thickened due to the field oxidation has a thickness on the order of 0.1 micron, it is difficult to form the drain region so as to underlie immediately beneath the gate oxide film having a uniform thickness. As a result of this, there arise the problems mentioned below.

In the nonvolatile semiconductor memory device, injection/discharge of electrons to/from the floating gate is realized by making use of the hot electron phenomenon and the tunnel phenomenon which per se are known in the art. It is however noted that the electron injection/discharge characteristics based on the hot electron/tunnel phenomena are very susceptible to the influence of the thickness of the gate oxide film. Consequently, when the drain region is formed in overlapping the thickened region of the gate oxide film, the electron injection/discharge characteristics undergo deterioration which is ascribable to the thickening of the gate oxide film. In addition, due to variance or dispersion in the extent of ingression of the field oxide film, the electron injection/discharge characteristics undergo variations, which in turn incurs variations or differences in the programming voltage as well as the erase voltage from one to another memory cell, making it practically difficult or impossible to set the internal voltage for the nonvolatile semiconductor memory device.

In the nonvolatile semiconductor memory device manufactured according to the hitherto known method mentioned above, the n-type impurity diffused layer is formed between the adjacent memory cells such that the data wire and the source wire can be shared by the adjacent memory cells. However, according to the memory cell operating method disclosed, for example, in JP-A-3-219496 (Japanese Unexamined Patent Application Publication No. 219496/1991), data writing operation is performed simultaneously or en bloc for a plurality of memory cells. It is desirable to isolate the data line and the source line between the adjacent memory cells. In order to separate the metal layers for the diffused regions, the n-type impurity diffused layers which are to constitute the source region and the drain region, respectively, must be formed separately from each other by using a patterned photoresist layer as a mask. In that case, the width of the columnwise lines of the n-type impurity diffused region is determined by the mask alignment between the nitride film or polysilicon layer and the photoresist. This in turn means that variation in the mask alignment provides a cause for variation in the resistance value of the n-type impurity diffused layer. Needless to say, variation in the resistance value mentioned above in turn provides a cause for variation in the data read current, which thus presents a problem in implementation of the memory cell having the data wire separated.

SUMMARY OF THE INVENTION

In the light of the state of the art described above, it is an object of the present invention to provide a method of manufacturing a nonvolatile semiconductor memory device to obtain the gate oxide film region having a uniform thickness and suppress the variation in the resistance value.

Another object of the present invention is to provide a nonvolatile semiconductor memory device manufacturing method which is capable of implementing the nonvolatile semiconductor memory device with an increased scale of integration.

In view of the above and other objects which will become apparent as the description proceeds, the present invention provides a method of manufacturing a nonvolatile semiconductor memory device, which method includes at least a memory cell forming process mentioned below.

At least three layers including a gate oxide film, a first polysilicon layer and a first nitride film are sequentially deposited on a silicon substrate surface and patterned with stripe-like lines extending in a columnwise direction. Subsequently, a second nitride film is deposited and then removed to a depth corresponding to the thickness of deposition through an anisotropic etching process to thereby allow the second nitride film to remain only on the side walls of the columnwise lines each constituted by the three layers. Thus, the first polysilicon layer is covered with the first nitride film and the second nitride film. An element isolating insulation film (i.e., insulation film for isolating memory cells from one another) is formed in the silicon substrate surface which is not covered with the first and second nitride films, for example, by oxidizing the silicon substrate surface. Thereafter, the first and second nitride films are removed, and ions are implanted to the silicon substrate surface which is not covered with the first polysilicon layer and the element isolating insulation film, to thereby form diffused layers for lines extending e.g. in the columnwise direction. Furthermore, a first insulation film is deposited and anisotropically etched to form the first insulation film on the side walls, respectively, of the first polysilicon layer. Subsequently, at least two layers including a second insulation film and a second polysilicon layer are deposited, whereon rowwise lines extending substantially orthogonally to the columnwise lines are formed at least by the second polysilicon layer through a patterning process. As a result of this, the first polysilicon layer is implemented in the form of rectangular parallelepiped, which is to serve as a floating gate.

The first polysilicon layer functions as the floating gate for storing or accumulating electrons while the second polysilicon layer serves as a word line. Each of the diffused layers of the columnwise line array formed on the silicon substrate surface which are not covered with the first polysilicon layer and the element isolating insulation film serves as a source or drain region and at the same time plays a role of wiring layer (diffused wiring layer). The memory cell is constituted by the floating gate, the word line and the source/drain regions. The sources and drains of the memory cells which are formed on the different rowwise lines, respectively, are connected in parallel by the respective diffused layers. The diffused layer for the drain serves, for example, as the data line or bit line, while the diffused layer for the source serves as a common source line or local source lines for the data lines, respectively.

In the memory cell structure according to the present invention, the first polysilicon layer is connected to the element or cell isolating insulation film by way of the first insulation film formed on the side walls of the first polysilicon layer. The element isolating insulation film may be formed, for example, by thermally oxidizing the silicon substrate. However, because the first polysilicon layer is covered with the first and second nitride films when the element or cell isolating insulation film is to be formed, the gate oxide film can be formed in a uniform thickness from the drain to the source while the first polysilicon layer and the underlying gate oxide film are protected against oxidation. The second nitride film is formed on the side walls of the columnwise line formed of at least three layers of the gate oxide film, the first polysilicon layer and the first nitride film. A region exposed after removal of the second nitride film is used as a window for forming the diffused layer. The second nitride film formed on the side wall has the width which is determined by the thickness of the second nitride film upon deposition thereof. Accordingly, by using the second nitride film having a thickness not greater than e.g. 0.2 micron, the width of the diffused layer can be diminished, while variance in the width of the windows mentioned above can be suppressed more positively when compared with deviations involved in the mask alignment. Thus, variations in the resistance value of the n-type impurity diffused layer as well as fluctuation in the memory-cell data read current can be suppressed to a minimum.

In this manner, with the method of manufacturing the nonvolatile semiconductor memory device according to the present invention, the problem of occurrence of nonuniformity in the thickness of the gate oxide film and variation in the width of the wiring diffused layer, as described hereinbefore in conjunction with the hitherto known technique, can satisfactorily be solved, whereby the memory cells constituting the nonvolatile semiconductor memory device can be implemented in a fine structure, which contributes to implementation of the nonvolatile semiconductor memory device with a larger scale of integration.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which.

DESCRIPTION OF THE PREFERRED EMBODIMENTS

Now, the present invention will be described in detail in conjunction with what is presently considered as preferred or typical embodiments thereof by reference to the accompanying drawings. In the following description, it is to be understood that such terms as "columnwise", "rowwise", and the like are words of convenience and are not to be construed as limiting terms.

Figure 1:
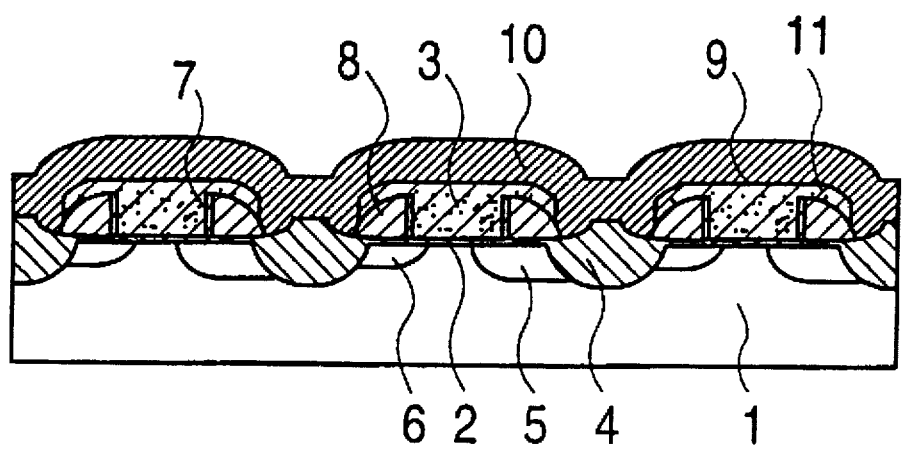
FIG. 1 is a sectional view showing a structure of a nonvolatile semiconductor memory device according to a first embodiment of the present invention taken along a line A—A' in FIG. 2.
Figure 5:
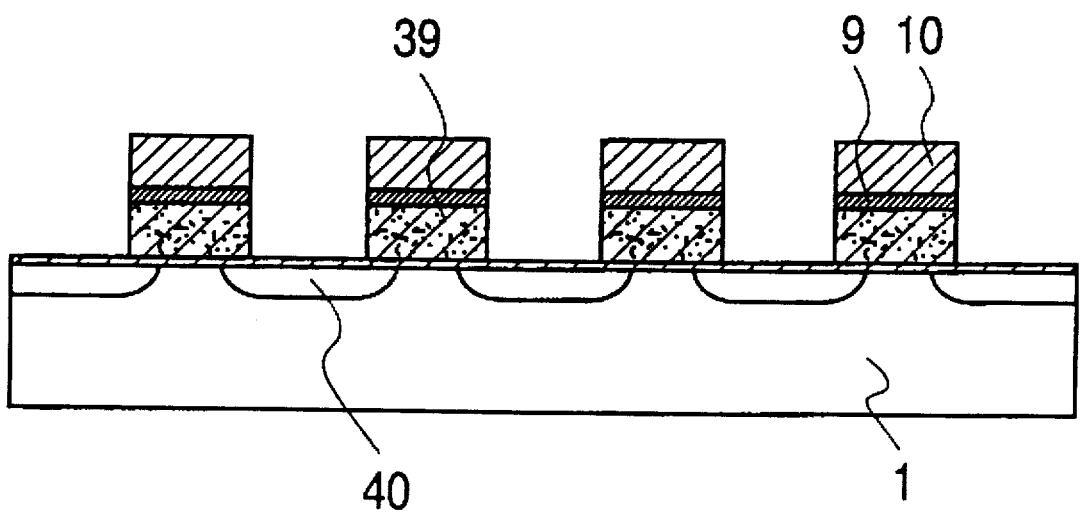
FIG. 5 is a sectional view taken along a line B—B' in FIG. 2 and shows a section of the nonvolatile semiconductor memory device according to the first embodiment of the invention on a plane perpendicular to that of FIG. 1.
Figure 2:
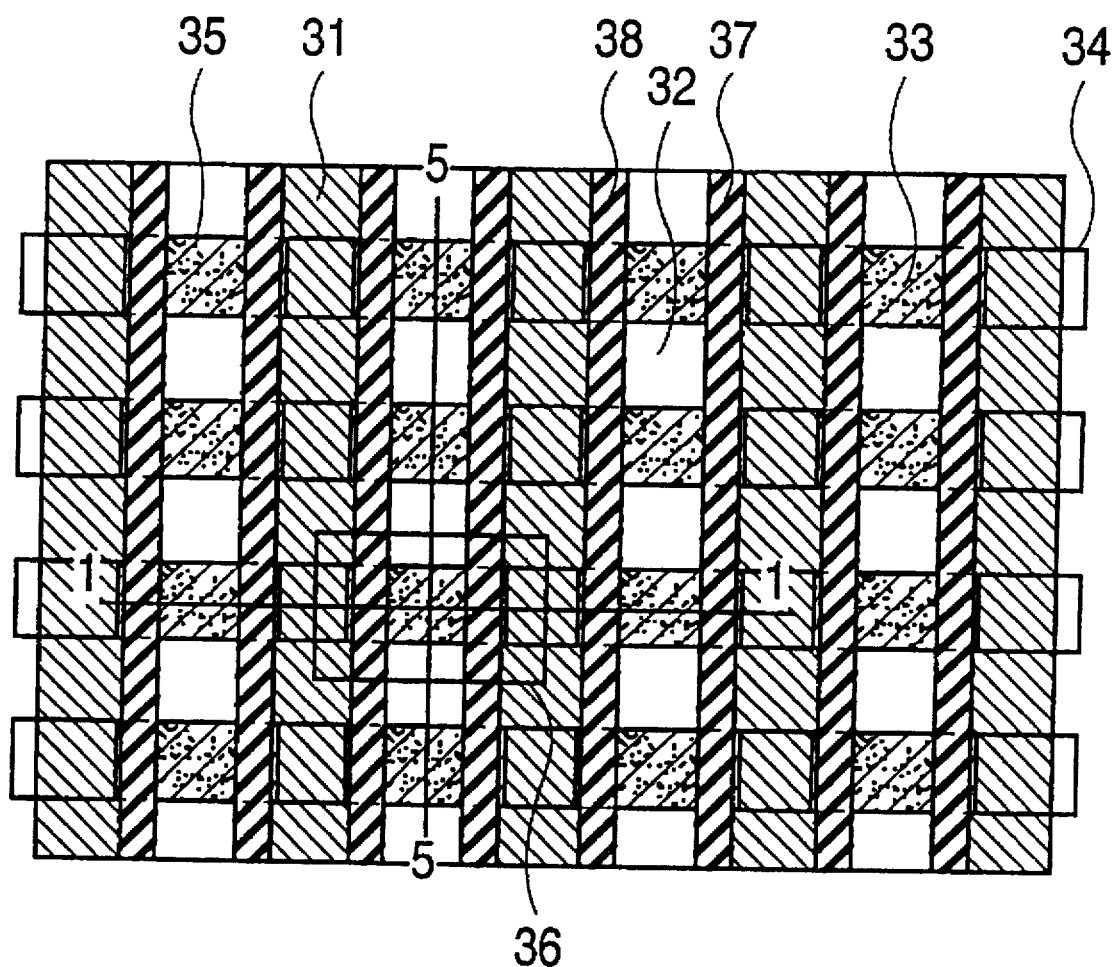
FIG. 2 is a plan view showing the same.

A first embodiment of the nonvolatile semiconductor memory device according to the present invention will be described by referring to FIGS. 1 to 5, in which FIG. 1 shows a structure of memory cells of the nonvolatile semiconductor memory device which correspond to three bits in a section taken along a line A—A' shown in FIG. 2, which in turn shows a pattern of a memory array portion of the same in a top plan view, and FIG. 5 shows a section of the same along a line B—B' in FIG. 2, wherein FIGS. 1 and 5 show a structure of the nonvolatile semiconductor memory device in the state implemented up to the formation of word lines, inclusive thereof. As is shown in FIG. 1, a floating gate serving as a charge or electron accumulating part of the memory cell is formed by polysilicon layers 3 and 11 which are electrically connected to each other. Further, a polysilicon layer 10 serves as a word line, wherein an insulation film 9 is formed between the polysilicon layers 10 and 11. On the other hand, a diffused drain region 5 and a diffused source region 6 are formed in a p-type semiconductor substrate 1 underneath a polysilicon layer 3 with a gate oxide film 2 being interposed therebetween. A cell isolating oxide film 4 is formed between the adjacent memory cells for electrically isolating the diffused drain region 5 of one memory cell from the diffused source region 6 of the other memory cell. Insulation film 8 are formed between the polysilicon layer 11 on one hand and the diffused drain region 5 and the diffused source region 6, respectively, on the other hand. Both sides of the polysilicon layer 3 are covered with oxide film 7.

Next, description will be made of correspondences existing between the sectional view of FIG. 1 and the top plan view of FIG. 2. A memory cell denoted generally by a numeral 36 in FIG. 2 is formed just underneath a word line formed by the polysilicon layer 10 (FIG. 1), while the polysilicon layer 3 (FIG. 1) is formed in a region 33 (FIG. 2) with the polysilicon layer 11 (FIG. 1) being formed in a region 35 (FIG. 2). The adjacent memory cells lying on a same word line are isolated from each other by a cell isolating oxide films 31 (corresponding to the film 4 in FIG. 1) which are formed in a columnwise direction. The diffused drain region 5 and the diffused source region 6 are formed in the columnwise direction underneath the insulation film 8 (FIG. 1) formed in regions 37 and 38 (FIG. 2), respectively. A region 32 shown in FIG. 2 functions to isolate those memory cells lying on the different word lines, respectively, and corresponds to a region of the structure shown in FIG. 5 in which neither floating gate nor word line is formed. In other words, although the insulation film 8 is formed in the region 32, there is formed neither the polysilicon layers 3 nor the polysilicon layers 11 and 10.

Figure 3A:
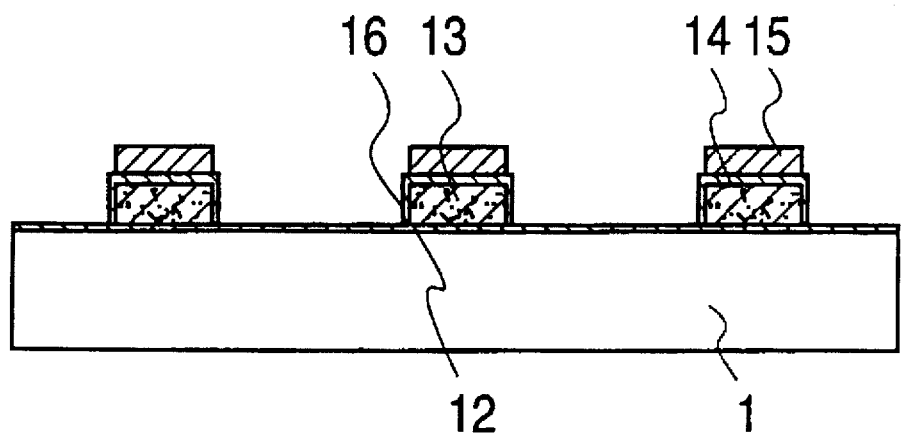
FIGS. 3(a), 3(b) and 3(c) are sectional views for illustrating a method of manufacturing a nonvolatile semiconductor memory device according to the first embodiment of the present invention.
Figure 3B:
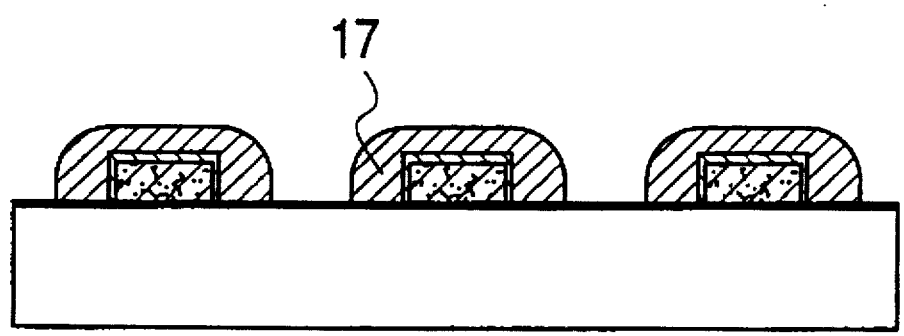
Figure 3C:
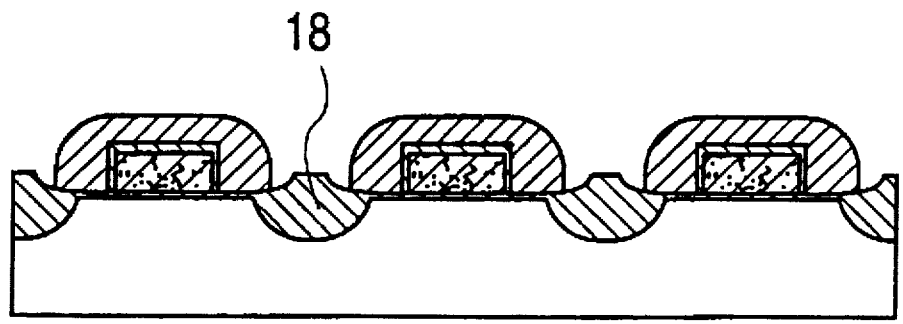
Figure 4A:
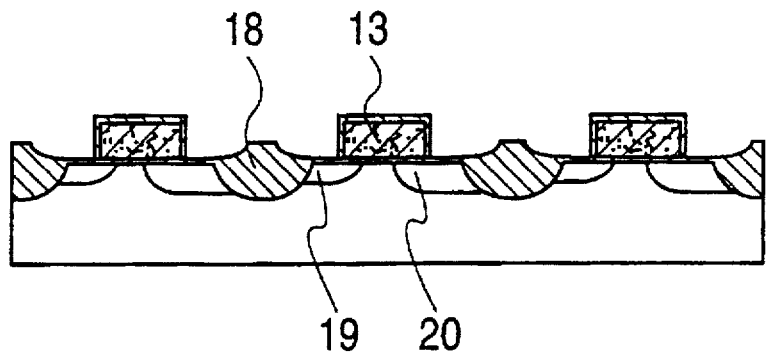
FIGS. 4(a) to 4(d) are views for illustrating the same and show processing steps carried out in succession to those shown in FIGS. 3(a) to 3(c)
Figure 4B:
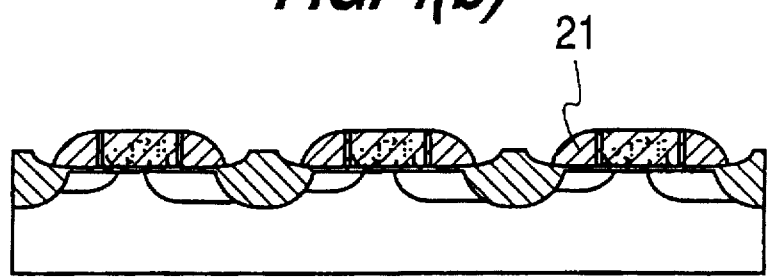
Figure 4C:
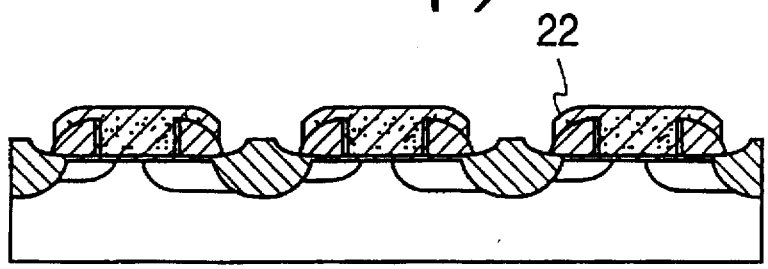
Figure 4D:
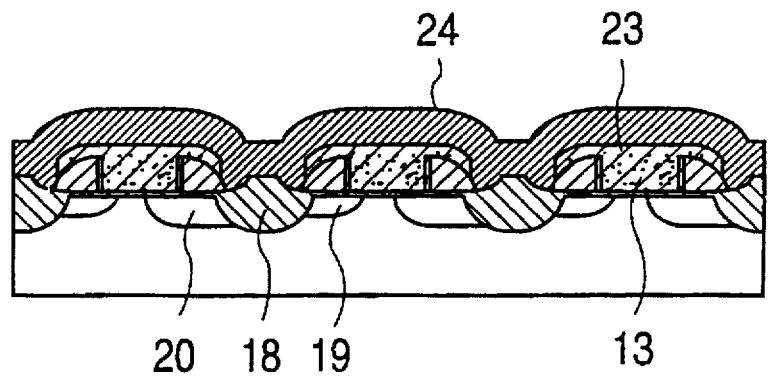

Now, description will turn to a method of manufacturing nonvolatile semiconductor memory device according to the first embodiment of the present invention by referring to FIGS. 3(a) to 3(c) and FIGS. 4(a) to 4(d), wherein FIGS. 4(a) to 4(d) show the manufacturing steps which succeed to those shown in FIGS. 3(a) to 3(c).

Referring to the figures, a gate oxide film 12 is formed over a surface of a p-type semiconductor substrate 1 in a thickness ranging from 7 to 10 nm, whereon a polysilicon film 13 is formed in a thickness of about 150 nm, which is then followed by formation of a deposited oxide film 14 of about 20 nm in thickness. Furthermore, a nitride film 15 is formed in a thickness of about 100 nm. At this juncture, it should be mentioned that the polysilicon layer 13 is doped with phosphorous ions with an impurity concentration not smaller than 1E 20 cm$^{-3}$. Subsequently, a photoresist layer is formed over the four layers 12, 13, 14 and 15 and then patterned with stripes (i.e., formed with a pattern of stripe-like lines), whereon the nitride film 15 and the deposited oxide film 14 are anisotropically etched by using the stripe-shaped photoresist layer as a mask.

After removal of the photoresist layer, the polysilicon layer 13 is anisotropically etched by using as a mask the nitride film 15 and the deposited oxide film 14. Thus, stripe-like lines each constituted by the polysilicon layer 13, the deposited oxide film 14 and the nitride film 15 are formed so as to extend in the columnwise direction. Furthermore, lateral surfaces or side walls of each of the polysilicon layer 13 are oxidized to form silicon oxide films 16, respectively, (see FIG. 3(a)).

Next, a nitride film 17 is deposited in a thickness of about 150 nm over the whole surface of the stripe structure and then anisotropically etched away to a depth of about 150 nm selectively so that the nitride films 17 can remain only on the lateral or side surfaces of the stripe-like lines (see FIG. 3(b)). In this manner, the polysilicon layer 13 can completely be covered with the nitride film 15 and the nitride film 17.

Now, the cell isolating oxide films 18 are formed on the exposed surface portions of the p-type semiconductor substrate 1 which are not covered by the nitride films 15 and the nitride films 17 by resorting to a process, for example, for oxidizing the exposed surface portions of the p-type semiconductor substrate 1 (see FIG. 3(c)). In this case, the conditions for the oxidation are set such that the thickness of the cell isolating insulation film 18 becomes greater than 200 nm inclusive thereof. Parenthetically, it should further be mentioned that a p-type diffused layer may be formed just beneath each of the cell isolating films 18 for isolating electrically the memory cells from one another in the device according to the instant embodiment, although the layer is not shown in the drawing. To this end, boron ions or compound ions containing boron are implanted by using, for example, an ion implantation method in the state shown in FIG. 3(b). After the formation of the cell isolating insulation film 18, the p-impurity diffused regions can be formed directly under the cell isolating insulation films 18, respectively. As is known in FIG. 3(c), the cell isolating insulation film 18 for the memory cell can be formed in a self-aligning manner, so to say, with reference to the mask which determines the so-called gate length of the memory cell.

Now, the nitride films 15 and 17 formed as mentioned above are removed through a wet etching process by using H$_3$PO$_4$ or the like. Incidentally, the wet etching process with H$_3$PO$_4$ or the like will etch away the polysilicon layer containing impurity at a high concentration. In this conjunction, it should be noted that in the case of the instant embodiment of the invention, the deposited oxide film 14 and the silicon oxide film 16 covering directly the polysilicon layer 13 serve as stopper layers for protecting the polysilicon layer 13 from being etched.

After the etching process mentioned above, there make appearance gaps each having a predetermined width not greater than ca. 150 nm between the polysilicon layers 13 and 14 and the cell isolating insulation films 18, respectively. By implanting the arsenic or phosphorous ions into the silicon substrate surface regions not covered with the polysilicon layers 13 and the cell isolating insulation films 18 by resorting to an ion implantation process to thereby form diffused layers 19 and 20 extending in the columnwise direction (see FIG. 4(a) in the form of lines). In the structure shown in FIG. 4(a), there is realized an asymmetric diffused-layer structure, because either one of the gaps formed at both sides of each polysilicon layer 13 is covered with a photoresist and then the other gap undergoes again the ion implantation process. In the case of the instant embodiment, the n-type diffused layer 19 is used as the source region while the n-type diffused layer 20 serves as the drain region. By virtue of such asymmetric diffused layer structure, electrons can move from the floating gate to the diffused layer of high impurity concentration under the tunnel effect. It should however be noted that when the tunnel discharge/injection of electrons are to be effected by making use of the whole channel surface, there is no need for forming positively the above-mentioned asymmetric diffused layer structure. In that case, the diffused layers of the memory cell shown in FIG. 1 may equally be implemented in a symmetrical structure.

Here, it should be noted that the above-mentioned gap, i.e., the distance between the polysilicon layer 13 and the cell isolating insulation film 18 remains constant among all the memory cells.

Subsequently, an insulation film 21 is deposited over the whole surface in a thickness of about 200 nm, whereon insulation films 21 are formed only on the side walls of each of the polysilicon layers 13 through an anisotropic etching process. In that case, the deposited oxide film 14 on the polysilicon layer 13 is removed concurrently through the anisotropic etching mentioned above. Incidentally, the insulation films 21 may equally be so formed as to cover the n-type diffused layers 19 and 20, respectively, (see FIG. 4(b)). Additionally, a polysilicon layer 22 doped with n-type impurity ions at a high concentration is formed in a thickness of about 50 nm, which is then formed with a columnwise line pattern in which each line has a width slightly greater than that of the columnwise line mentioned previously (FIG. 4(c)). The polysilicon layer 22 is provided in order to increase a capacitive coupling ratio of the memory cell (i.e., the ratio of the capacitance between the floating gate and the word line to the whole capacitance of the memory cell as viewed from the floating gate). In the case where a relatively high word line voltage is permissible, it is unnecessary to form the third polysilicon layer. At this juncture, it is to be noted that the polysilicon layer 22 is electrically connected to the polysilicon layer 13.

Thereafter, an insulation film 23 and a polysilicon layer 24 which is doped with n-type impurity ions at a high concentration are deposited. As in the case of formation of the columnwise lines, a photoresist layer is formed and a photoresist pattern of rowwise lines extending perpendicularly to the columnwise lines is formed by patterning the photoresist layer by using a mask. In succession, the polysilicon layer 24 and the insulation film 23 and hence the polysilicon layer 22 and the polysilicon layer 13 are formed in a corresponding pattern through an anisotropic etching process by using the above-mentioned photoresist as a mask. As a result of this, the polysilicon layer 24, the polysilicon layer 22 and the polysilicon layer 13 are shaped in the direction rowwise, whereby the polysilicon layers 13 are each implemented in the form of a rectangular parallelepiped. In the case of the instant embodiment of the invention, the floating gate for storing or accumulating electrons is formed by the polysilicon layer 13 and the polysilicon layer 22 (see FIG. 4(d)).

In the foregoing, the nonvolatile semiconductor memory device manufacturing method has been described up to the process or step for patterning the polysilicon layer 24 in the direction rowwise. It will however be understood that an inter-layer insulation film, contact holes for making electrical connections and metal layer for wiring are subsequently formed for thereby making it possible to drive electrically the memory cells, as is well known in the art. Again, it should be mentioned that the gap or distance between the polysilicon layer 13 and the cell isolating insulation film 18 is implemented to be constant among all the memory cells, which means that variance or dispersion of resistance of metal layers for wiring the drain and source regions can be suppressed to a minimum and thus the stable write/erase/read operations can be ensured.

Figure 6A:
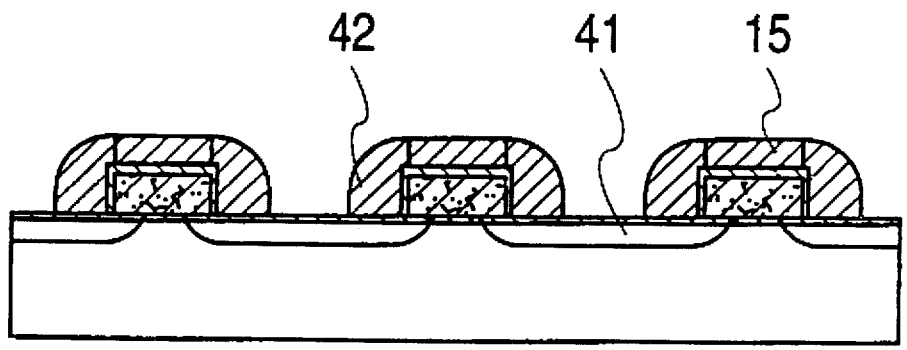
FIGS. 6(a), 6(b) and 6(c) are schematic sectional views for illustrating a method of manufacturing a nonvolatile semiconductor memory device according to a second embodiment of the present invention.
Figure 6B:
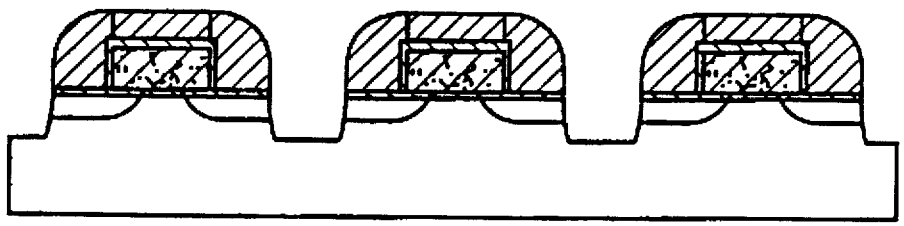
Figure 6C:
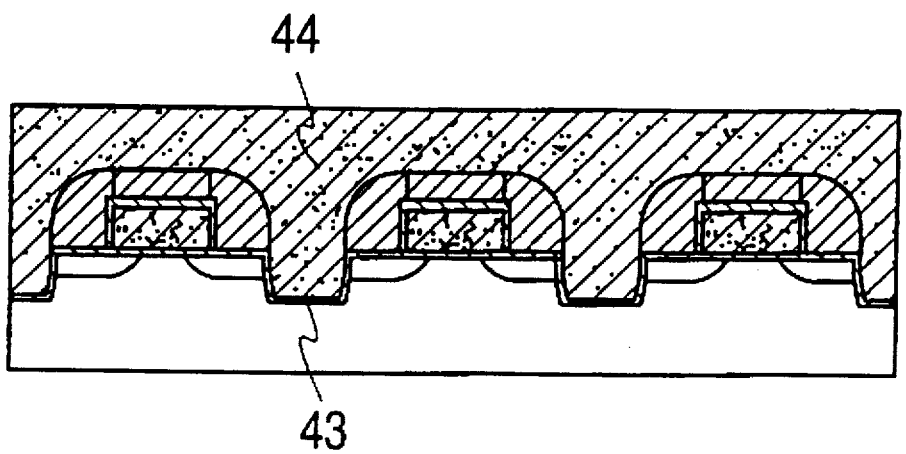
Figure 7A:
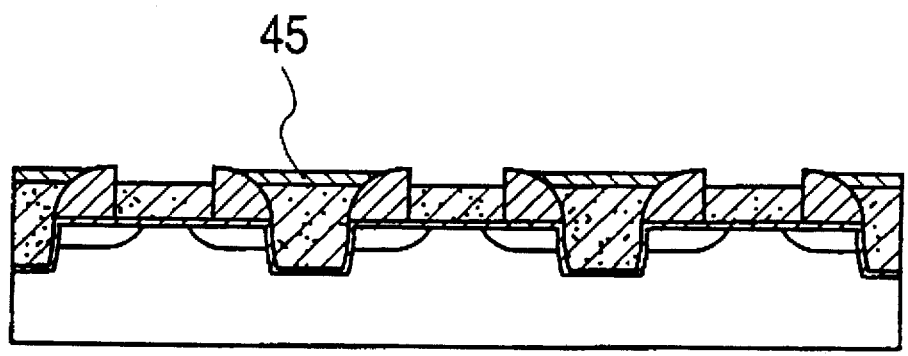
FIGS. 7(a), 7(b) and 7(c) are schematic sectional views for illustrating the same and show processing steps which are carried out in succession to those shown in FIG. 6(c)
Figure 7B:
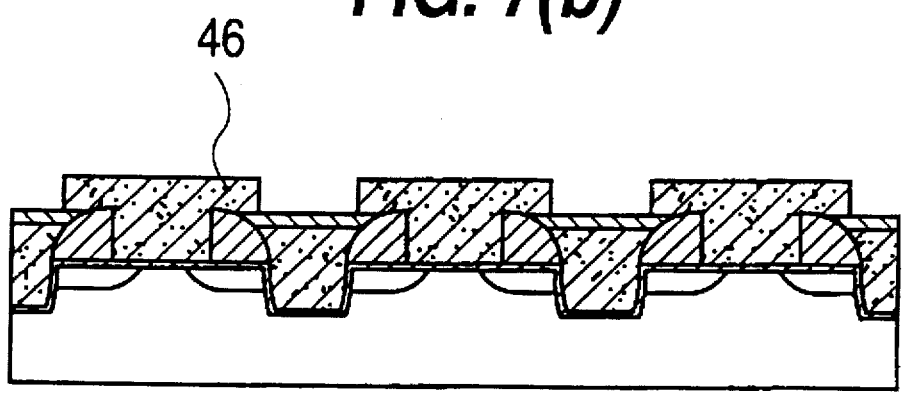
Figure 7C:
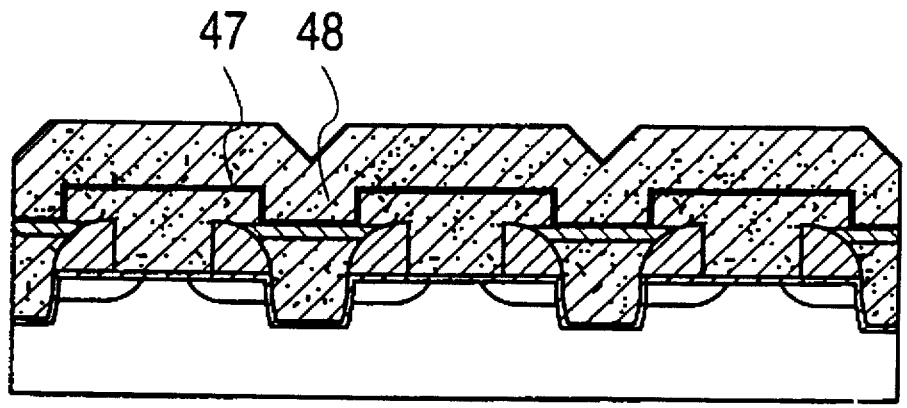

Next, a nonvolatile semiconductor memory device manufacturing method according to a second embodiment of the present invention will be described by reference to FIGS. 6(a) to 6(c) and 7(a) to 7(c), in which FIGS. 7(a) to 7(c) show processing steps which are carried out in succession to those shown in FIGS. 6(a) to 6(c). The instant embodiment of the invention is directed to a method of forming a cell isolating insulation film in a self-aligning manner by using an isolating region of a shallow groove. Referring to FIGS. 6 and 7, in succession to the processing step described hereinbefore in conjunction with the first embodiment and shown in FIG. 3(a), impurity ions are implanted into the silicon substrate through an ion implantation process to thereby form source and drain regions for the memory cells by using the nitride film 15 as a mask. Subsequently, an oxide film is deposited in a thickness of about 150 nm and then etched by an isotropic oxide film etching process to a depth equivalent to the thickness so that deposited oxide films 42 are formed on the side walls of the columnwise lines (see FIG. 6(a)).

In succession, those regions of the silicon substrate surface which are not covered with the nitride film 15 and the deposited oxide film 42 are removed away to a depth of about 0.2 microns to thereby form the groove regions through an anisotropic silicon etching process, which is then followed by a wet process of the silicon substrate by using a silicon etching solution in order to suppress occurrence of crystal defects in the succeeding steps (see FIG. 6(b)).

Now, by oxidizing the silicon substrate surface, the surfaces of the groove regions are oxidized, whereby oxide films 43 are formed. Subsequently, a polysilicon layer 44 doped with p-type impurity ions is deposited over the whole surface. To this end, the polysilicon layer may preferably be deposited in a thickness of about 600 nm for realizing a substantially flat surface (see FIG. 6(c)).

The polysilicon layer 44 is then etched back through an isotropic silicon etching process to thereby remove the polysilicon layer 44 to a depth corresponding to about 30% of the thickness of the nitride film 15 from a level where the nitride film 15 is exposed after removal of the polysilicon layer 44. In this manner, only the polysilicon layer 44 which fills the shallow groove is left, wherein the surface height of the layer 44 is located substantially at a middle of the deposited oxide film 42 formed on the side wall of the polysilicon layer 13. Next, the surface of the polysilicon layer 44 is oxidized through an oxidizing process to thereby form an oxide film 45 having a thickness of about 100 nm. Additionally, the nitride film 15 is removed through a wet etching process conducted by using $H_3PO_4$ or the like and then the deposited oxide film 14 on the polysilicon layer 13 is removed through an oxide film wet etch process or anisotropic etching process (see FIG. 7(a)).

Now, a polysilicon layer 46 doped with n-type impurity ions at a high concentration is deposited in a thickness of about 50 nm, whereon the polysilicon layer 46 is patterned with lines each having a width greater than the columnwise lines by using a corresponding mask (FIG. 7(b)).

Next, an insulation film 47 is deposited in a thickness of abut 15 nm, which is then followed by deposition of a polysilicon layer 48. Subsequently, a photoresist layer is formed as in the case of formation of the columnwise lines, whereon a resist pattern of rowwise lines extending orthogonally to the columnwise lines is formed through a patterning by using a correspondingly shaped mask. In succession, patterning of the polysilicon layer 48 and the insulation film 47 and hence the polysilicon layer 46 and the polysilicon layer 13 is performed through an anisotropic etching process by using the above-mentioned photoresist pattern as a mask, as a result of which the polysilicon layer 48, the polysilicon layer 46 and the polysilicon layer 13 are realized in the form of lines extending in the rowwise direction with the polysilicon layer 13 being implemented in the form of a rectangular parallelepiped. In the case of the instant embodiment of the invention, the floating gate for storing or accumulating electrons is formed by the polysilicon layer 13 and the polysilicon layer 46 (see FIG. 7(c)).

In the foregoing, the nonvolatile semiconductor memory device manufacturing method according to the second embodiment of the invention has been described up to the step of forming the polysilicon layers 48 serving as the word lines in the rowwise direction by the patterning. It should however be understood that metal layers for wirings are subsequently formed by resorting to the conventional techniques, as described previously in conjunction with the first embodiment of the invention.

Next, referring to FIG. 8, description will be made of a third embodiment of the invention which is directed to a method of manufacturing a nonvolatile semiconductor memory device which differs from that of the first embodiment in that a source region is shared by the adjacent memory cells. Turning back to FIG. 3(a), the stripe-like columnwise lines are so formed that the distance between the adjacent lines are less than, for example, 300 nm. Subsequently, the nitride film 17 is deposited in a thickness of about 150 nm and then removed through an anisotropic etching process so that the nitride film 17 remains only on the side walls or surfaces of the columnwise lines. Through this process, the space between the columnwise lines at the source region where the inter-line gap is narrow is filled with the nitride film 17 and thus the silicon substrate surface remains unexposed (see FIG. 8(a) ).

Figure 8A:
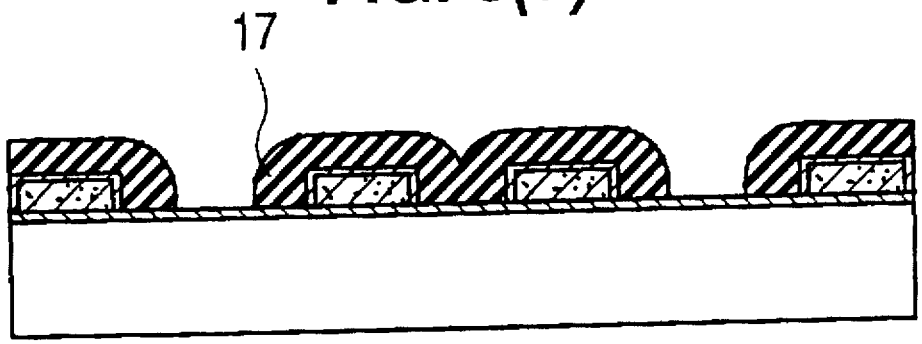
FIGS. 8(a), 8(b), 8(c) and 8(d) are schematic sectional views for illustrating a method of manufacturing a nonvolatile semiconductor memory device according to a third embodiment of the present invention.
Figure 8B:
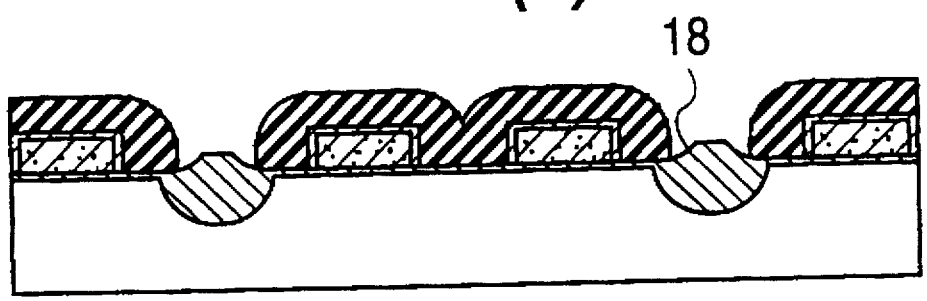
Figure 8C:
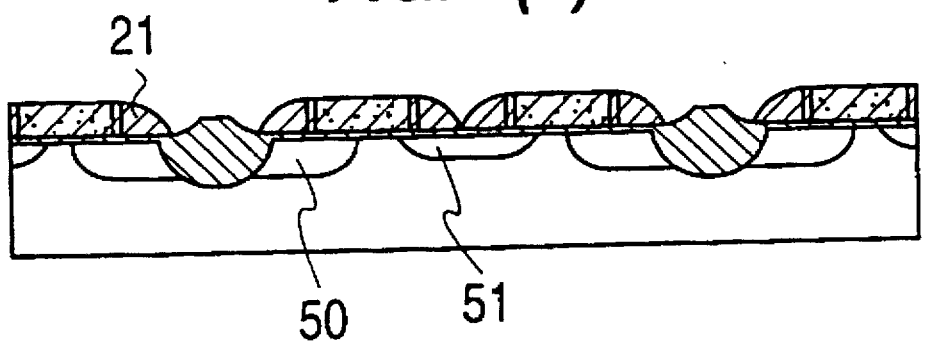
Figure 8D:
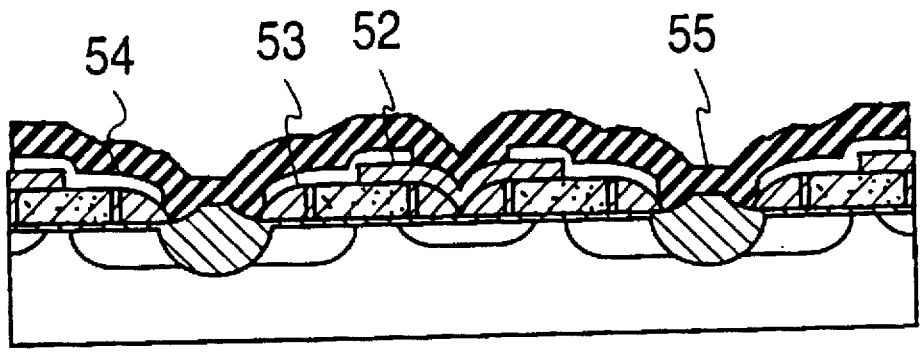

The regions of the silicon substrate surface which are not covered with the nitride film 17 is oxidized through a thermal oxidation process to thereby form the cell isolating insulation film 18 (see FIG. 8(b)). In succession, the nitride film 17 is removed and ion implantation is performed for forming a diffused drain layer 50 at the drain region with a diffused source layer 51 for the shared source region being formed by implanting ions. The insulation film 21 is then deposited over the whole surface in a thickness of about 200 nm, whereupon the insulation film 21 is removed so that it remains only on the side walls of the polysilicon layer 13 through an anisotropic etching process (see FIG. 8(c)). It should be noted that in the source region where the inter-line gap between the columnwise lines is narrow, the silicon substrate surface can substantially be covered with the insulation film 21.

Furthermore, an insulation film 52 is deposited, whereon the insulation film 21 is so processed by resorting to a photoresist process or the like that two adjacent floating gates are partially covered. Thereafter, through the process similar to that mentioned hereinbefore in conjunction with the first embodiment, a polysilicon layer 53 is patterned with lines each having a width slightly greater than the columnwise line mentioned previously, whereupon an insulation film 54 and a polysilicon layer 55 are deposited.

As in the case of formation of the columnwise lines, a photoresist layer is formed and patterned by using a mask for forming a photoresist pattern of rowwise lines extending orthogonally to the columnwise lines. Subsequently, the polysilicon layer 55, the insulation oxide film 54, the polysilicon layer 53, the insulation film 52 and the polysilicon layer 13 are sequentially patterned into rowwise lines by using the photoresist layer as the mask. As a result of this, there are formed memory cells each having the floating gate formed by the polysilicon layers 13 and 53. In the foregoing, description has been made up to the process for patterning the polysilicon layer 55 in the rowwise direction for forming the word lines. It will however be understood that the inner-layer insulation film, contact holes for making electric connection, and metal layers for wiring can be formed through the conventional processes known in the art for making it possible to drive electrically the memory cells constituting the nonvolatile semiconductor memory device.

As will now be appreciated, with the memory cell structure according to the present invention, the top surface as well as the side surfaces of the polysilicon layer overlying the gate insulation film are covered with the insulation film such as a nitride film, an oxide film or the like, Consequently, the polysilicon layer and the gate oxide film underlying directly the polysilicon layer are positively protected against oxidation upon formation of the cell isolating insulation film, as a result of which a uniform thickness can be ensured for the gate oxide film. Thus, the problems of the memory cells known heretofore such as nonuniformity in the thickness of the oxide film at the distal portions of the gate oxide film and thickening due to ingress of so-called bird's beak can be suppressed to a minimum, whereby variation and deterioration in the characteristics of the hot electron injection and the tunnel-phenomenon-based electron injection can be suppressed satisfactorily. Besides, in conjunction with the formation of the cell isolating insulation film by thermally oxidizing the silicon substrate, it should be noted that the source/drain regions are formed after formation of the cell isolating insulation film. By virtue of this feature, the thermal process is rendered unnecessary after the ion implantation, whereby the trend of the diffused layers to spread can effectively be suppressed. Thus, the memory cell having the gate length on the order of submicrons can be developed.

On the other hand, because the width of metal layer for wiring the diffused region constituting the source and the drain of the memory cell can be determined by the width of the nitride or oxide films formed on the side walls of the polysilicon layer constituting the floating gate, high controllability for the width of the metal layers can be realized, whereby variation or dispersion thereof can significantly be reduced when compared with the mask aligning method known heretofore. Thus, variation in the memory cell current in the data reading operation can ultimately be mitigated, whereby the number of memory cells which can be connected in parallel can be increased, which provides thus a great contribution to the manufacturing of integrated semiconductor memory devices with an increased scale of integration.

What is claimed is:

1. A method of manufacturing a nonvolatile semiconductor memory device, comprising at least the steps of:
   depositing on a semiconductor surface of a first conductivity type at least three layers including a gate oxide film, a first polysilicon layer and a first insulation film;
   patterning said three layers into stripe columnwise lines;
   forming a second insulation film on side walls of said columnwise lines, respectively;
   forming an element isolating region on the semiconductor surface of the first conductivity type which is not covered with said first insulation film and said second insulation film;
   depositing a second polysilicon layer; and
   patterning said second polysilicon layer and said first polysilicon layer into rowwise lines which extend substantially orthogonally to said columnwise lines.

2. A method of manufacturing a nonvolatile semiconductor memory device according to claim 1,
   wherein the distance between said first polysilicon layer and said element isolating region is not greater than 150 nm, said distance remaining substantially the same among a plurality of memory cells each having a floating gate formed by said first polysilicon layer.

3. A method of manufacturing a nonvolatile semiconductor memory device according to claim 1,
   wherein the distance between said first polysilicon layer and said element isolating region is not greater than 150 nm, said distance formed at both sides of said first polysilicon layer, respectively, being substantially equal to each other.

4. A method of manufacturing a nonvolatile semiconductor memory device, comprising at least the steps of:
   depositing on a semiconductor surface of a first conductivity type at least three layers including a gate oxide film, a first polysilicon layer and a first nitride film;
   patterning said three layers into stripe columnwise lines;
   forming a second nitride film on side walls of said columnwise lines, respectively;
   forming an element isolating insulation film on the semiconductor surface of the first conductivity type which is not covered with said first nitride film and said second nitride film;
   removing said first nitride film and said second nitride film and forming an impurity diffused layer of a second conductivity type in a columnwise line pattern on the semiconductor surface of said first conductivity type which is not covered with said first polysilicon layer and said element isolating insulation film;
   forming a first insulation film on side walls of said first polysilicon layer;
   depositing at least two layers including a second insulation film and a second polysilicon layer; and
   patterning said second polysilicon layer, said second insulation film and said first polysilicon layer into rowwise lines which extend substantially orthogonally to said columnwise lines.

5. A method of manufacturing a nonvolatile semiconductor memory device according to claim 4,
   wherein the distance between said first polysilicon layer and said element isolating region is not greater than 150 nm, said distance remaining substantially the same among a plurality of memory cells each having a floating gate formed by said first polysilicon layer.

6. A method of manufacturing a nonvolatile semiconductor memory device according to claim 4,
   wherein the distance between said first polysilicon layer and said element isolating region is not greater than 150 nm, said distance formed at both sides of said first polysilicon layer, respectively, being substantially equal to each other.

7. A method of manufacturing a nonvolatile semiconductor memory device, comprising at least the steps of:
   depositing on a semiconductor surface of a first conductivity type at least three layers including a gate oxide film, a first polysilicon layer and a first nitride film;
   patterning said three layers into stripe columnwise lines;
   forming an impurity diffused layer of a second conductivity type in the form of columnwise lines on said semiconductor surface of the first conductivity type which is not covered with said stripe-like columnwise lines;
   forming a first insulation film on said walls of said columnwise lines;
   forming an element isolating region of a groove structure on said semiconductor surface of the first conductivity type which is not covered with said first nitride film and said first insulation film;
   removing said first nitride film and depositing at least two layers including a second insulation film and a second polysilicon layer; and
   patterning said second polysilicon layer, said second insulation film and said first polysilicon layer into rowwise lines which extend substantially orthogonally to said columnwise lines.

8. A method of manufacturing a nonvolatile semiconductor memory device according to claim 7,
   wherein the distance between said first polysilicon layer and said element isolating region is not greater than 150 nm, said distance remaining substantially the same among a plurality of memory cells each having a floating gate formed by said first polysilicon layer.

9. A method of manufacturing a nonvolatile semiconductor memory device according to claim 7,
   wherein the distance between said first polysilicon layer and said element isolating region is not greater than 150 nm, said distance formed at both sides of said first polysilicon layer, respectively, being substantially equal to each other.

10. A method of manufacturing a nonvolatile semiconductor memory device according to claim 1, wherein the second insulation film is formed on side walls of said columnwise lines by forming a layer of material of the second insulation film and anistropically etching said layer of material of the second insulation film.

11. A method of manufacturing a nonvolatile semiconductor memory device according to claim 10, wherein said layer of material of the second insulation film has a thickness not greater than 0.2 micron.

12. A method of manufacturing a nonvolatile semiconductor memory device according to claim 1, wherein diffused layers of said first conductivity type are formed under said element isolating region.

* * * * *